United States Patent
Dowd

[19]

[11] Patent Number: 6,111,758
[45] Date of Patent: Aug. 29, 2000

[54] ELECTRONIC COMPONENT HAVING ALTERNATE FUNCTIONALITIES

[75] Inventor: Doyle N. Dowd, Alpharetta, Ga.

[73] Assignee: Scientific-Atlanta, Inc., Norcross, Ga.

[21] Appl. No.: 09/100,282

[22] Filed: Jun. 19, 1998

[51] Int. Cl.[7] .................................................. H05K 7/10
[52] U.S. Cl. ..................... 361/760; 361/811; 361/104; 361/111; 361/835; 361/837; 337/4; 174/521
[58] Field of Search ................................. 361/760, 811, 361/833, 58, 104, 111, 627–630, 835, 837; 337/4, 255, 260; 174/52.1

[56] References Cited

U.S. PATENT DOCUMENTS

| | | | |
|---|---|---|---|
| 3,662,317 | 5/1972 | Digirolamo et al. | 338/174 |
| 3,840,781 | 10/1974 | Brown | 361/58 |
| 4,968,962 | 11/1990 | Hohider et al. | 337/4 |
| 5,204,498 | 4/1993 | Russell | 174/52.1 |
| 5,673,028 | 9/1997 | Levy | 340/635 |
| 5,859,580 | 1/1999 | Hasihizawa et al. | 337/260 |

*Primary Examiner*—Leo P. Picard
*Assistant Examiner*—David Foster
*Attorney, Agent, or Firm*—Kelly A. Gardner; Kenneth M. Massaroni; Hubert J. Barnhardt, III

[57] ABSTRACT

An electronic component (100) includes a body portion (105) for enclosing first and second electronic devices (415, 430). The component (100) has first and second leads (110, 115) extending therefrom for providing a connection to the first device (415) and third and fourth leads (125, 130) extending from the component (100) for providing a connection to the second device (430). The first device (415) can be a short circuit connection, a fuse, or a resistor, while the second device (430) can be a different device, such as an open circuit connection. When the first and second leads (110, 115) are inserted into a connector (205) of an external circuit (202), the first device (415) is electrically coupled to the circuit (202). When, alternatively, the third and fourth leads (125, 130) are inserted into the connector (205), the second device (430) is electrically coupled to the circuit (202).

16 Claims, 2 Drawing Sheets

ELECTRONIC COMPONENT HAVING ALTERNATE FUNCTIONALITIES

FIELD OF THE INVENTION

This invention relates generally to electronic components, and more specifically to electronic components having multiple functionalities.

BACKGROUND OF THE INVENTION

Electrical devices, such as amplifiers, transmitters, and receivers, typically include one or more printed circuit boards on which a plurality of electronic components are mounted. Electronic components that are intended to remain in a device for its useful life are usually permanently mounted, such as by soldering the components to pads formed on a printed circuit board. Electronic components that may need to be removed from the device can also be soldered to pads of the printed circuit board. However, removal of the component then requires the use of a soldering iron, which can present difficulties for field removal of the component, especially when the device is located far from a power source for powering the soldering iron.

Removable components can instead be mounted to the printed circuit in other ways, such as by inserting leads of a plug-in component into a connector that is permanently mounted to a printed circuit board. In this manner, the component can be easily removed from the connector and replaced with a similar component or a different component. In an amplifier, for example, a fuse shunt can be plugged into a connector to provide a short circuit to conduct power to the amplifier during normal operation. When the amplifier is to be repaired, the fuse shunt is removed altogether so that power is interrupted, thereby reducing the risk of electrical shock. Other types of electrical devices use plug-in resistors or capacitors, and, when the value of such a plug-in component is to be changed, the component is removed and replaced with a separate plug-in component having the desired value.

In either situation, the plug-in component that is removed can be easily lost, which can cause device malfunctions and which can require that a replacement component be ordered, thereby wasting time and money. Also, replacement of plug-in components can require that a technician carry a number of components while servicing devices in the field, which can be inconvenient and sometimes impractical.

DETAILED DESCRIPTION OF A PREFERRED EMBODIMENT

Figure 1:
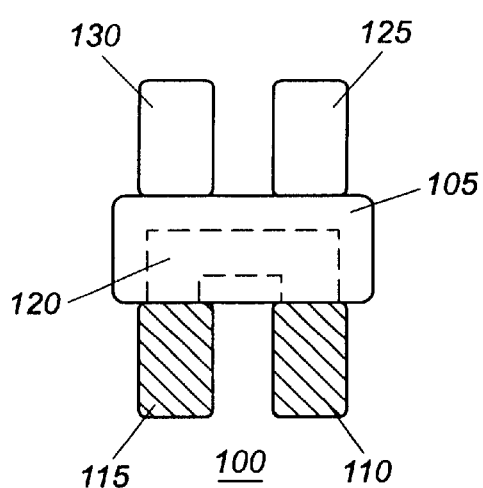
FIG. 1 is a side view of an electrical component that has alternative functionalities according to the present invention.
Figure 2:
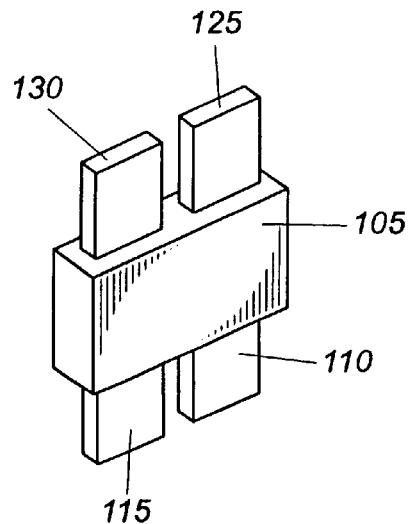
FIG. 2 is a perspective view of the electrical component of FIG. 1 according to the present invention.

FIGS. 1 and 2 are side and perspective views of an electronic component 100 having alternative functionalities according to the present invention. As shown, the component 100 includes a body portion 105 having top and bottom opposing surfaces. First and second conductive leads 110, 115 extend from the bottom surface of the component 100, while third and fourth leads 125, 130 extend from the top surface. The third and fourth leads will hereinafter be referred to as "contacts", rather than leads, to avoid confusion.

Figure 3:
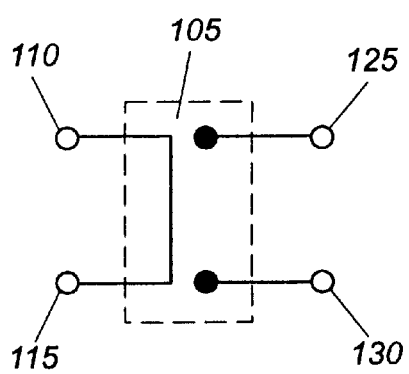
FIG. 3 is an electrical circuit diagram of electrical devices that can be included in the electrical component of FIG. 1 according to the present invention.

The first and second leads 110, 115 provide an electrical connection to a first electronic device located within the body 105, and the first and second contacts 125, 130 provide an electrical connection to a second electronic device located within the body 105. In a preferred embodiment of the present invention, depicted in FIG. 3, the leads 110, 115 are electrically coupled to provide a short circuit connection, and the contacts 125, 130 provide an open circuit connection. The short circuit connection can be provided, for instance, by forming the leads 110, 115 from a single piece of material 120 (FIG. 1), such as a metal, or by connecting the two leads 110, 115 by a jumper, such as a piece of copper wire, prior to enclosing ends of the leads 110, 115 within the body 105. The open circuit connection can be provided by electrically separating the contacts 125, 130. This can be done by ensuring that the two contacts 125, 130 do not touch or by forming the contacts 125, 130 from an electrically insulative material, such as plastic, that does not conduct current. It will be appreciated that, if the open circuit is provided by contacts 125, 130 that do not touch, the surrounding body material should be formed from a nonconductive material, such as plastic, so that the surrounding material does not provide an electrical connection between the two contacts 125, 130.

Figure 4:
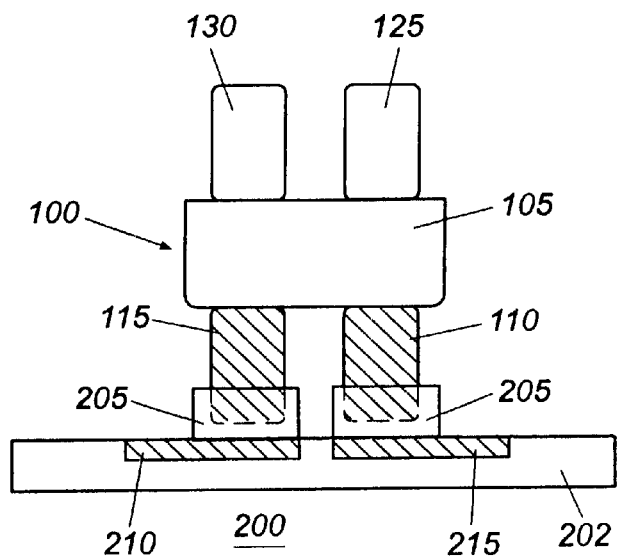
FIG. 4 is a side view of the electrical component of FIG. 1 mounted to a circuit board according to the present invention.

According to the present invention, the two functionalities of the component 100 can be provided in the alternative, as will be explained in greater detail below. Referring next to FIG. 4, the electrical component 100 is coupled to a substrate, such as a printed circuit board 202, to form an electronic assembly 200 that can be used in any device requiring plug-in components. As shown, the first and second leads 110, 115 of the component 100 are coupled to a connector 205 to provide a short circuit connection between a first circuit 210 and a second circuit 215, both of which can comprise printed circuitry, as depicted, and additional components (not shown). In this manner, the first circuit 210 and the second circuit 215 are shorted together. When the component 100 s then turned to couple the contacts 125, 130 to the connector 205, an open circuit is provided between the first and second circuits 210, 215.

A component 100 that includes an open circuit and a short circuit as first and second devices, respectively, that are alternatively coupled to an external circuit can be useful when current flow in a device, e.g., an amplifier, or power supplied to a device is to be temporarily interrupted, such as for repair or shipping. According to the present invention, the component 100 can be simply removed, physically turned, then plugged in using different leads so that the technician need not make any special effort to keep up with the component 100. It will be appreciated that, as a further convenience, the two different functionalities of the component 100 can be indicated by labels, printing, color coding, or any other method that indicates to a technician the difference between the different internal devices of the component 100.

Figure 5:
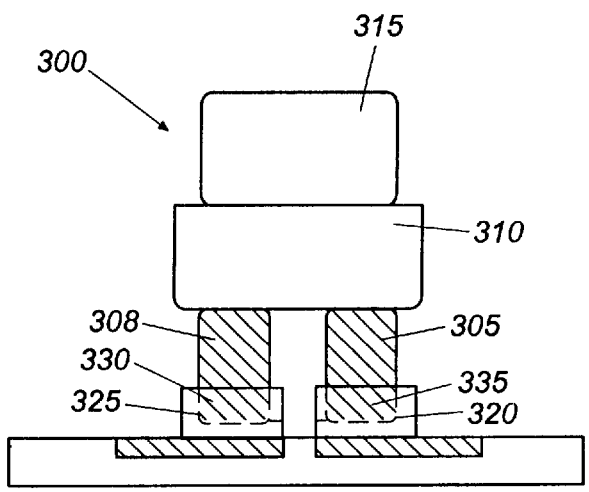
FIG. 5 is a side view of an alternative embodiment of the electrical component of FIG. 1 according to the present invention.

FIG. 5 illustrates a component 300 manufactured in accordance with an alternate embodiment of the present invention. The component 300 includes conductive tabs 305, 308 extending from the body portion 310 and a nonconductive tab 315 extending from a different region of the body portion 310, thereby selective providing either an open circuit or a short circuit. This type of configuration can be useful when only a single tab is necessary to provide a connection between first and second connectors 320 325. The connectors 320, 325 can, for instance, include first and second apertures 330, 335 that are cut the length of the connectors 320, 325 so that the conductive tabs 305, 308 can be inserted into both connectors 320, 325 to provide a short circuit therebetween. The single nonconductive tab 315 can also be inserted into the apertures 330, 335 of the connectors 320, 325.

Figure 6:
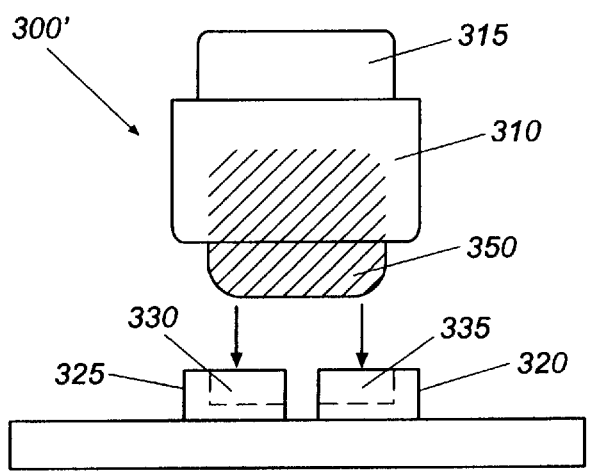
FIG. 6 is a side view of a second alternative embodiment of the electrical component of FIG. 1 according to the present invention.

In FIG. 6, an alternate embodiment of the present invention is shown in which the component 300' includes a single nonconductive tab 315 for providing the open circuit connection and also another single conductive tab 350 for providing the short circuit connection. As mentioned above, this will work when, for instance, the connectors 320, 325 include first and second apertures 330, 335 that are cut the length of the connectors 320, 325 so that the single conductive tab 350 can be inserted into both connectors 320, 325 to provide a short circuit therebetween. One of ordinary skill in the art will understand that, since an open circuit connection is to be provided by the tab 315, the fit between the nonconductive tab 315 and the connectors 320, 325 is not as important as the fit between the conductive tab 350 and the connectors 320, 325.

It will be appreciated that the component parts can be configured in a variety of other shapes and sizes. For instance, the tabs 115, 110 (FIG. 1) and contacts 125, 130 could be more rounded, thinner, thicker, or located on other regions of the body 105 as long as the corresponding connector 205 is configured for proper coupling thereto. It will also be appreciated that the first and second electronic devices to which the tabs 110, 115 and the contacts 125, 130 are respectively coupled need not be limited to open and short circuits.

Figure 7:
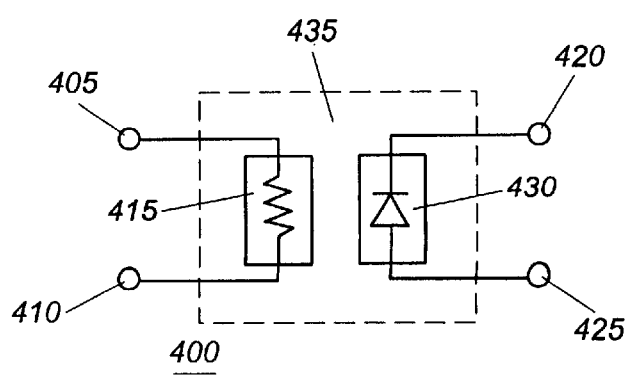
FIG. 7 is an electrical circuit diagram of different electrical devices that can be included in the electrical component of FIG. 1 according to the present invention.

FIG. 7 is a circuit diagram of a component 400 that can include different first and second devices 415, 430 enclosed within the body portion 435. For example, the first device 415 could comprise a resistor coupled between first and second conductive leads 405, 410, and the second device 430 could comprise a diode coupled between first and second conductive contacts 420, 425 to prevent current from flowing in a particular direction. It will be recognized that other devices could instead be used. For instance, the second device 430 could include a resistor of a different value or any other type of electrical component. The component 400 could be configured to be similar in appearance to that of FIG. 1.

In summary, the component described above includes two different electronic devices enclosed within a body portion. Connections to the first electronic device are made via a first set of leads extending from the body, and connections to the second electronic device are made via a second set of leads extending from the body. In this manner, the component can be plugged into a connector of an external circuit to alternatively provide the functionalities the two different devices.

What is claimed is:

1. An electronic component, comprising:
a nonconductive body;
first and second conductive leads extending from the nonconductive body, the first and second conductive leads electrically coupled to each other to provide a short circuit therebetween; and
first and second contacts extending from the nonconductive body to provide an open circuit therebetween, the first and second contacts electrically and physically separated from the first and second conductive leads,
wherein the first and second conductive leads can be coupled to an external circuit to provide a short circuit connection between the first and second conductive leads and the external circuit, and wherein and the first and second contacts can alternatively be coupled to the external circuit to provide an open circuit connection between the first and second contacts and the external circuit.

2. The electronic component of claim 1, wherein the nonconductive body comprises plastic.

3. The electronic component of claim 1, wherein the first and second conductive leads comprise a metal.

4. The electronic component of claim 1, wherein the first and second contacts comprise a nonconductive material.

5. The electronic component of claim 1, wherein the first and second contacts are formed from electrically conductive material.

6. The electronic component of claim 1, wherein the body includes top and bottom surfaces opposite each other, the first and second conductive leads extend from the top surface, and the first and second contacts extend from the bottom surface.

7. An electronic assembly, comprising:
a substrate including a connector mounted thereon and further including circuitry mounted to the substrate and electrically coupled to the connector; and
an electronic component including first and second devices, at least one lead coupled to the first device and electrically isolated from the second device, and at least one contact coupled to the second device and electrically isolated from both the first device and the at least one lead,
wherein the electronic component can be removably coupled to the connector using either the at least one lead or the at least one contact, and the at least one lead and the at least one contact are formed on the electronic component such that they are physically separated by a distance great enough that, when the at least one lead is mechanically coupled to the connector, the at least one contact is mechanically separated from the connector and, when the at least one contact is mechanically coupled to the connector, the at least one lead is mechanically separated from the connector
wherein, when the electronic component is coupled to the connector via the at least one lead, the first device is electrically coupled to the circuitry and the second device is electrically isolated from the circuitry, and, when the electronic component is coupled to the connector via the at least one contact, the second device is coupled to the circuitry and the first device is electrically isolated from the circuitry.

8. The electronic assembly of claim 7, wherein the first device comprises a short circuit connection.

9. The electronic assembly of claim 7, wherein the second device comprises an open circuit connection.

10. The electronic assembly of claim 7, wherein the at least one lead is electrically conductive.

11. The electronic assembly of claim 7, wherein the at least one contact is electrically insulative.

12. The electronic assembly of claim 7, wherein the at least one lead is inserted into the connector to electrically couple the first device to the circuit, and the at least one contact is inserted into the connector to electrically couple the second device to the circuit.

13. The electronic assembly of claim 7, wherein the first device comprises a resistor.

14. An electronic assembly, comprising:

a substrate having a connector mounted thereon, the connector including first and second apertures for receiving another device, wherein the first aperture is electrically coupled to a first circuit, and wherein the second aperture is electrically coupled to a second circuit; and an electronic component including first and second conductive leads coupled together to provide a short circuit connection, first and second nonconductive contacts between which is formed an open circuit connection, and a body from which the first and second conductive leads and the first and second nonconductive contacts extend, wherein, when the first and second conductive leads are inserted into the first and second apertures of the connector, a short circuit is formed between the first and second circuits and, when the first and second nonconductive contacts are inserted into the first and second apertures of the connector, an open circuit is formed between the first and second circuits.

15. The electronic assembly of claim 14, wherein the electronic assembly comprises an amplifier.

16. The electronic assembly of claim 14, wherein the substrate comprises a printed circuit board.

* * * * *

UNITED STATES PATENT AND TRADEMARK OFFICE
CERTIFICATE OF CORRECTION

PATENT NO.   : 6,111,758 B1                                              Page 1 of 1
DATED        : August 29, 2000
INVENTOR(S)  : Dowd It is certified that error appears in the above-identified patent and that said Letters Patent is hereby corrected as shown below:

Column 2,
Line 50, after "100" delete "s" and insert therefore -- is --

Column 3,
Line 6, delete "selective" and insert therefore -- selectively --
Line 9, insert a comma between "320" and "325"
Line 62, insert "of" between "functionalities" and "the"

Signed and Sealed this

Twenty-fifth Day of December, 2001

Attest:

JAMES E. ROGAN
Attesting Officer                Director of the United States Patent and Trademark Office